United States Patent
Tsai

(10) Patent No.: US 7,423,249 B2
(45) Date of Patent: Sep. 9, 2008

(54) LAYOUT TECHNIQUE FOR ADDRESS SIGNAL LINES IN DECODERS INCLUDING STITCHED BLOCKS

(75) Inventor: Richard H. Tsai, Alhambra, CA (US)

(73) Assignee: Micron Technology, Inc., Boise, ID (US)

( * ) Notice: Subject to any disclaimer, the term of this patent is extended or adjusted under 35 U.S.C. 154(b) by 789 days.

(21) Appl. No.: 10/760,480

(22) Filed: Jan. 21, 2004

(65) Prior Publication Data

US 2004/0150735 A1 Aug. 5, 2004

Related U.S. Application Data

(62) Division of application No. 09/860,031, filed on May 16, 2001, now Pat. No. 6,795,367.

(60) Provisional application No. 60/204,371, filed on May 16, 2000.

(51) Int. Cl.
*H01L 27/00* (2006.01)
*H04N 3/14* (2006.01)

(52) U.S. Cl. .................... 250/208.1; 348/302

(58) Field of Classification Search ............. 250/208.1, 250/214 R; 348/302
See application file for complete search history.

(56) References Cited

U.S. PATENT DOCUMENTS

| | | | |
|---|---|---|---|
| 4,622,670 A | 11/1986 | Martin | |
| 4,910,162 A | 3/1990 | Yasaka et al. | |
| 5,125,048 A * | 6/1992 | Virtue et al. | 382/205 |
| 5,195,053 A | 3/1993 | Hayano | |
| 5,208,875 A * | 5/1993 | Virtue et al. | 382/260 |
| 5,220,518 A | 6/1993 | Haq | |
| 5,295,116 A | 3/1994 | Iwashita | |
| 5,297,085 A | 3/1994 | Choi et al. | |
| 5,301,162 A | 4/1994 | Shimizu | |
| 5,323,357 A | 6/1994 | Kaneko | |
| 5,336,879 A * | 8/1994 | Sauer | 250/208.1 |
| 5,369,281 A * | 11/1994 | Spinnler et al. | 250/370.09 |
| 5,446,859 A | 8/1995 | Shin et al. | |
| 5,553,026 A | 9/1996 | Nakai et al. | |
| 5,583,822 A | 12/1996 | Rao | |
| 5,621,690 A | 4/1997 | Jungroth et al. | |
| 5,736,724 A * | 4/1998 | Ju et al. | 235/462.11 |
| 5,777,672 A * | 7/1998 | Cazaux et al. | 348/316 |
| 5,909,026 A * | 6/1999 | Zhou et al. | 250/208.1 |
| 5,949,061 A * | 9/1999 | Guidash et al. | 250/208.1 |
| 5,978,277 A | 11/1999 | Hsu et al. | |
| 5,982,680 A | 11/1999 | Wada | |
| 6,026,021 A | 2/2000 | Hoang | |
| 6,055,207 A | 4/2000 | Nam | |
| 6,057,539 A * | 5/2000 | Zhou et al. | 250/208.1 |
| 6,204,792 B1 | 3/2001 | Andersson | |
| 6,236,683 B1 | 5/2001 | Mougeat et al. | |
| 6,314,042 B1 | 11/2001 | Tomishima et al. | |
| 6,366,526 B2 | 4/2002 | Naffziger et al. | |
| 6,424,589 B2 | 7/2002 | Mochida | |
| 6,452,149 B1 * | 9/2002 | Yamashita et al. | 250/208.1 |
| 6,487,315 B2 | 11/2002 | Kadono | |

(Continued)

*Primary Examiner*—Stacey A Whitmore
(74) *Attorney, Agent, or Firm*—Dickstein Shapiro LLP

(57) ABSTRACT

A decoder block includes a number of generic blocks stitched together. The generic blocks have an address line layout that enables the decoders to be addressed with a reduced number of signal lines.

2 Claims, 6 Drawing Sheets

U.S. PATENT DOCUMENTS

| | | |
|---|---|---|
| 6,496,400 B2 | 12/2002 | Chevallier |
| 6,529,639 B1 * | 3/2003 | Young .................. 382/276 |
| 6,642,494 B1 * | 11/2003 | Endo .................. 250/208.1 |
| 6,642,965 B1 * | 11/2003 | Nagata et al. .......... 348/340 |
| 6,690,076 B1 * | 2/2004 | Fossum et al. ......... 257/431 |
| 6,710,847 B1 * | 3/2004 | Irie ..................... 355/53 |
| 6,787,749 B1 * | 9/2004 | Zhou et al. ........... 250/208.1 |
| 6,822,682 B1 * | 11/2004 | Kawajiri et al. ........ 348/315 |
| 6,842,225 B1 * | 1/2005 | Irie ..................... 355/67 |
| 2001/0041297 A1 * | 11/2001 | Nishi .................... 430/5 |
| 2003/0193593 A1 * | 10/2003 | Lee et al. ............... 348/302 |
| 2004/0036846 A1 * | 2/2004 | Nishi .................... 355/18 |
| 2004/0070740 A1 * | 4/2004 | Irie ..................... 355/52 |
| 2006/0113460 A1 * | 6/2006 | Tay ................... 250/208.1 |

\* cited by examiner

LAYOUT TECHNIQUE FOR ADDRESS SIGNAL LINES IN DECODERS INCLUDING STITCHED BLOCKS

This application is a divisional of and claims priority to U.S. Application Ser. No. 09/860,031, filed on May 16, 2001, now issued as U.S. Pat. No. 6,795,367, entitled "Layout Technique for Address Signal Lines in Decoders Including Stitched Blocks," which claims priority to U.S. Provisional Application Ser. No. 60/204,371, filed on May 16, 2000, entitled "An Optimal Layout Technique for Row/Column Decoders to Reduce Number of Blocks," the entirety of which are incorporated herein by reference.

BACKGROUND

Many semiconductor processing foundries have a maximum lithographic size they may use to form a chip. A common limit, for example, is 20×20 mm². Making a chip larger than that maximum size may be carried out using stitching. Stitching forms different portions of the chip in different areas of the wafer. The different areas are then "stitched" together with interconnect lines to form the overall chip.

Complicated chips may require a large number of stitches to form an entire circuit. The complexity of the chips may increase the cost and defect rate of the chips and lower throughput in the chip production process.

SUMMARY

A binary decoder block according to an embodiment includes a number N of generic blocks which are stitched together. Each generic decoder block includes a number of address lines for addressing decoders in the generic decoder block, and no more than $2*(2^k-1)+N$ block address lines for addressing the generic blocks, where k is the whole number portion of $\log_2(N-1)$.

A gray decoder block according to an embodiment includes a number N of generic blocks which are stitched together. Each generic decoder block includes a number of address lines for addressing decoders in the generic decoder block, and no more than $2*(2^k-1)+2(N-1)$ block address lines for addressing the generic blocks.

A decoder block according to an alternate embodiment includes a number N of generic blocks which are stitched together. Each generic decoder block includes a number of address lines for addressing decoders in the generic decoder block, and no more than N block address lines. The decoder block includes a block address decoder for selecting block address lines corresponding to a selected generic block in the decoder block.

In a sensor including the decoder block and a pixel section, the features in the decoder block may have a smaller pitch than the features in the pixel section, for example, a ratio of 0.98 or less. The smaller pitch of the decoder block may provide more area on the silicon surface of the chip for the-routing liens used to stitch together the component blocks of the decoder block. Interconnects between the decoder block and the pixel section may be angled to accommodate the larger stitching sections.

DETAILED DESCRIPTION

Figure 1:
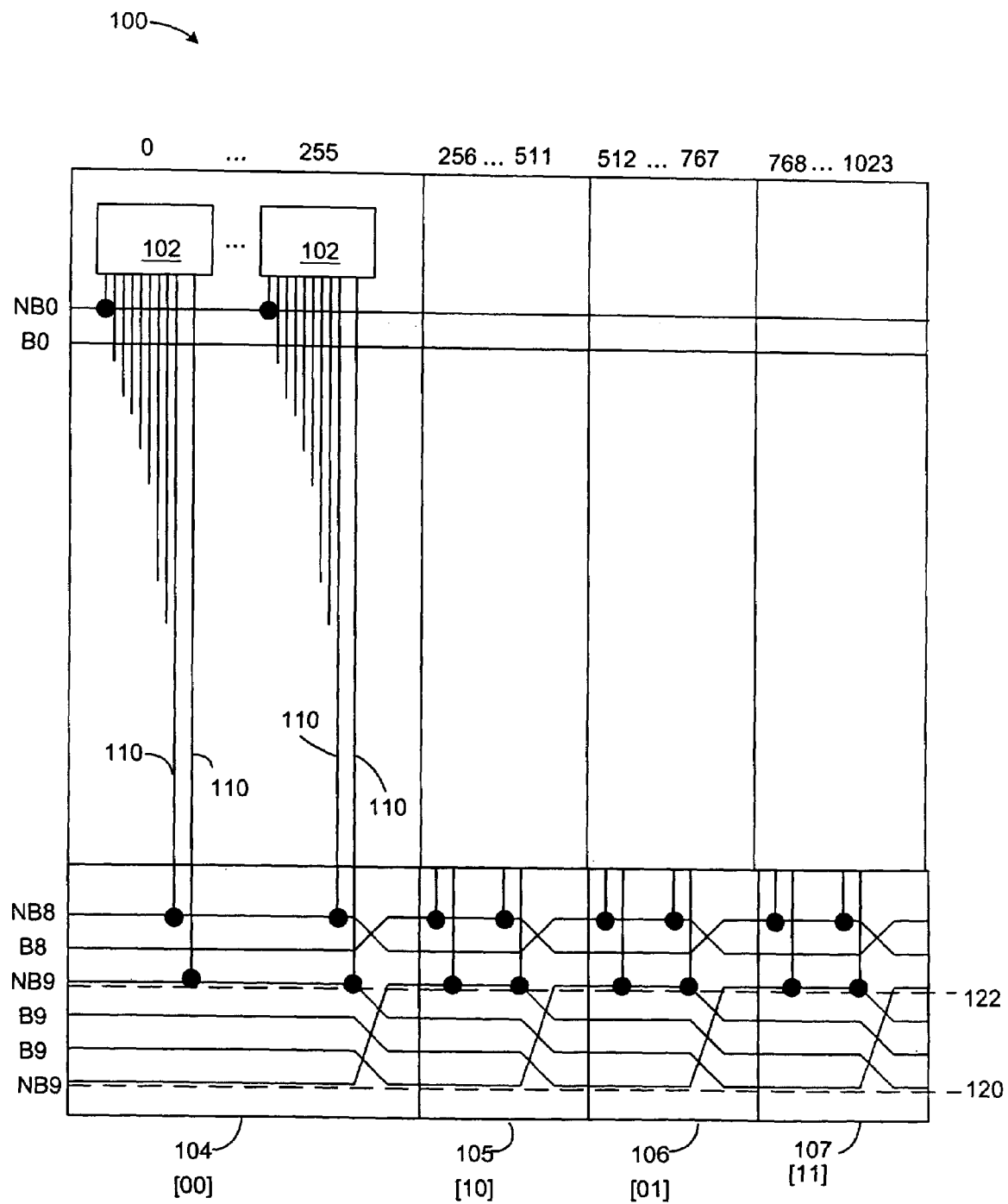
FIG. 1 is a schematic diagram of a binary decoder including four stitched generic blocks according to an embodiment.

The present disclosure describes a layout technique for stitching blocks together to form row and/or column decoders for use in large image sensors. These sensors are often larger than the typical reticle size of 20×20 mm². Thus, these sensors may need to be stitched together using several blocks. A decoder block for use in the image sensor may include a number of different blocks stitched together to form the complete decoder block. An exemplary column decoder block 100 may use 1024 column decoders 102 with a 25 μm pitch, as shown in FIG. 1. To accommodate a typical reticle size of 20×20 mm², requires that this block be divided into four pieces. According to an embodiment, instead of using four blocks with different designs, a block with a generic design may be used repeatedly. The use of generic blocks may save area on the reticle and reduce the complexity of the overall design.

Each generic block 104-107 includes 256row or column decoders 102, numbered from 0 to 1023 in the decoder block 100. In order to address each decoder 102 individually, each generic block includes address signal lines 112, i.e., address signal lines NB0-9 capable of generating a 10-bit address for the 1024 decoders. The signals on lines NB0-NB9 are the inverse signals of lines B0-B9, respectively. The 10-bit addresses of decoders may be split logically into an 8-bit portion (NB0-B7) to identify the 256 inblock decoder positions, and a 2-bit portion (NB8-B9) to identify the four generic blocks 104-107. The block signal lines NB8-B9 are a subset of the address signal lines NB0-B9. Although FIG. 1 is described with reference to signal lines NB0-B9. for simplicity address signal lines NB1-B7 are not shown.

The block signal lines are NB8-B9 are interleaved such that they switch position between adjacent blocks. The position of lines N38 and B8 switch between each block. The bottom signal line 120 of the four lines in the NB9/B9 section in a block 104, 105, 106 crosses over the other three lines and switches position to be the top line 122 in the next adjacent block 105, 106, 107, respectively. Also, the NB9 and B9 lines are arranged such that the type of the top signal line 122 in the NB9/B9 section changes in the sequence NB9, NB9, B9, B9 in generic blocks 204204 104-107. With B9=1 and NB9=0, this sequence is [0011].

Each decoder 102 in the generic block includes block addressing lines 110 representing the two most significant bits of the decoder's 10-bit address. The address signal lines 111 for each decoder 102 in the generic block are connected to the top signal line in each NB8/B8 and NB9/B9 sections, respectively. With the described layout, each of the generic blocks 104-107 has a different block addresses, [00], [10], [01], and [11], respectively.

Figure 2:
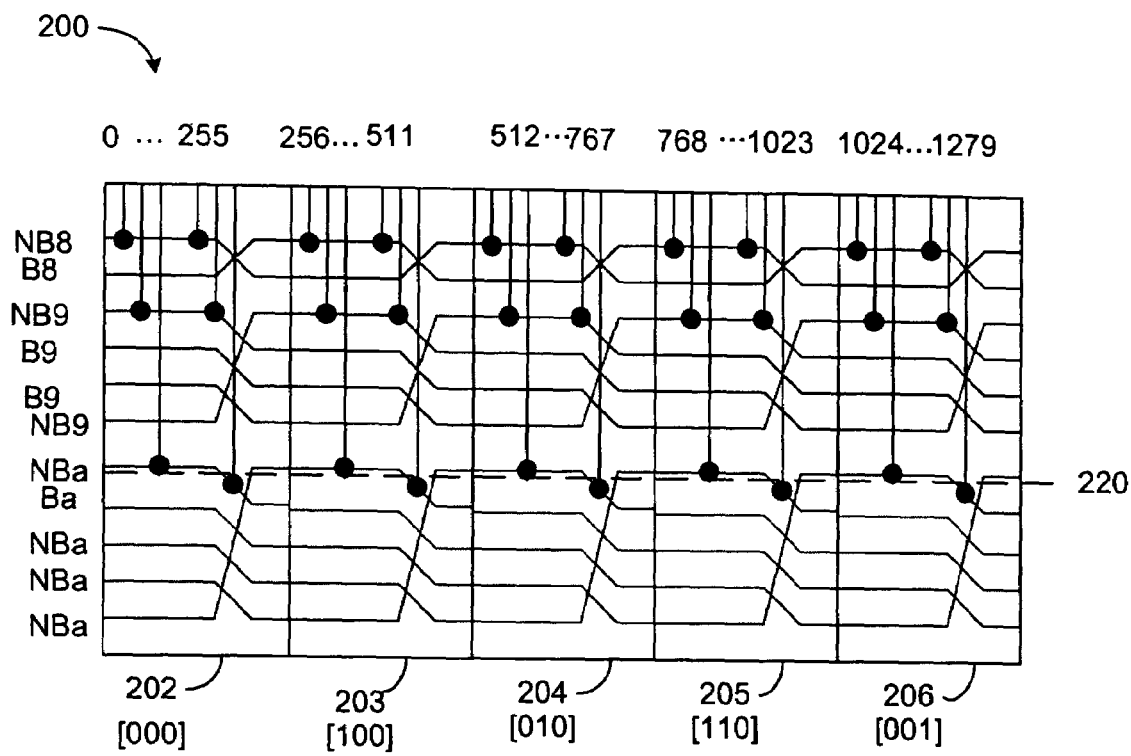
FIG. 2 is a schematic diagram of a block address line section in a generic block for use in a binary decoder including five stitched blocks according to an embodiment.

The technique may be expanded to accommodate a larger number of generic blocks. FIG. 2 illustrates an exemplary decoder block 200 including five generic blocks 202-206 stitched together to provided 1280 decoders. Each decoder has an 11-bit address, including an 8-bit portion to identify the 256 in-block decoder positions, as described above, and a 3-bit portion to identify the generic block position. The block address signal lines 110 includes an NB8/B8 section with two block address signal lines, an NB9/B9 section with a four block address signal lines, and an NBa/Ba section, corresponding to the third bit of the block address, with five block address signal lines. Address signal lines in the NBa/Ba section are arranged such that the type of top signal lines 220 changes in the sequence [00001111]. Accordingly, in the five block example, the sequence is [00001] from block 202 to block 206.

The number of signal lines, S(N), required for a given number of blocks, N, may be expressed by the series S (2)=2, S(3)=2+3=5, S(4)=2+4=6, S (5)=2+4+5=11, S (6)=2+4+6=12, etc., or generically by the following formula:

$S(N)=2*(2^k-1)+N; k=[(\log_2(N-1)]$, where k is the whole number portion of the logarithm.

Decoder blocks used in very large sensors may use gray code rather than straight binary code. Gray code is an ordering of binary numbers such that only one bit changes from one state to the next. This may avoid errors, since there is no way of guaranteeing that all bits will change simultaneously at the boundary between two encoded values. For example, using straight binary, it would be possible to generate an output of $0111_2$ ($15_{10}$) in going from $1110_2$ ($7_{10}$) to $1000_2$ ($8_{10}$).

Figure 3:
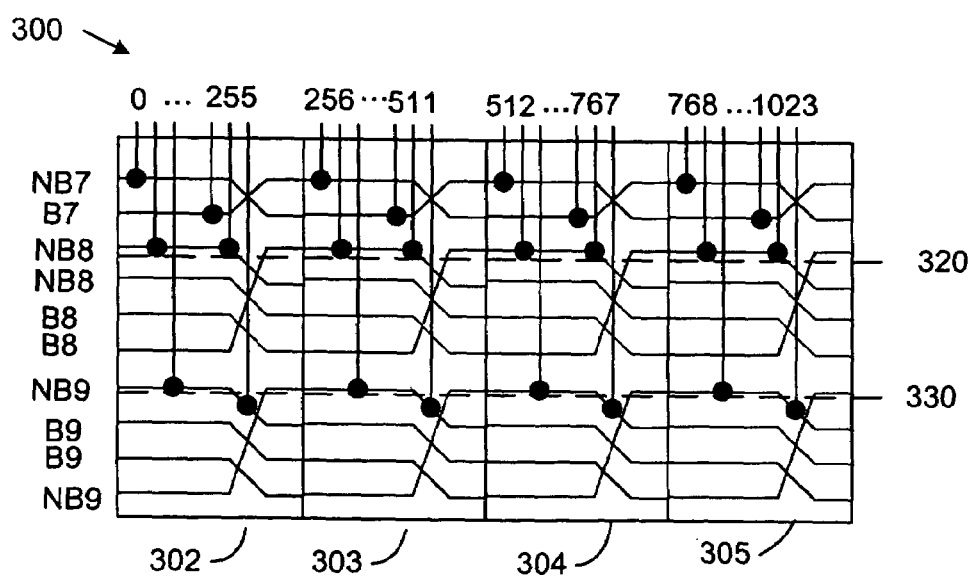
FIG. 3 is a schematic diagram of a block address line section in a generic block for use in a gray code decoder including four stitched blocks according to an embodiment.

FIG. 3 illustrates an exemplary gray code decoder block 300 including four generic blocks 302-305 stitched together. For the gray decoder, signal lines NB7 and B7 switch position between generic blocks. In each generic block 302-305, the address lines of the decoders in relative positions 0-127 (first half) are connected to NB7, and the address lines of the decoders in relative positions 128-255 (second half) are connected to B7. There are four signal lines in each of the NB8/N8 and NB9/B9 sections. The sequence of the type of the top signal line 320 in the NB8/N8 section is [0110], and the sequence of the type of the top signal line 330 in the NB9/B9 section is [0011].

Figure 4:
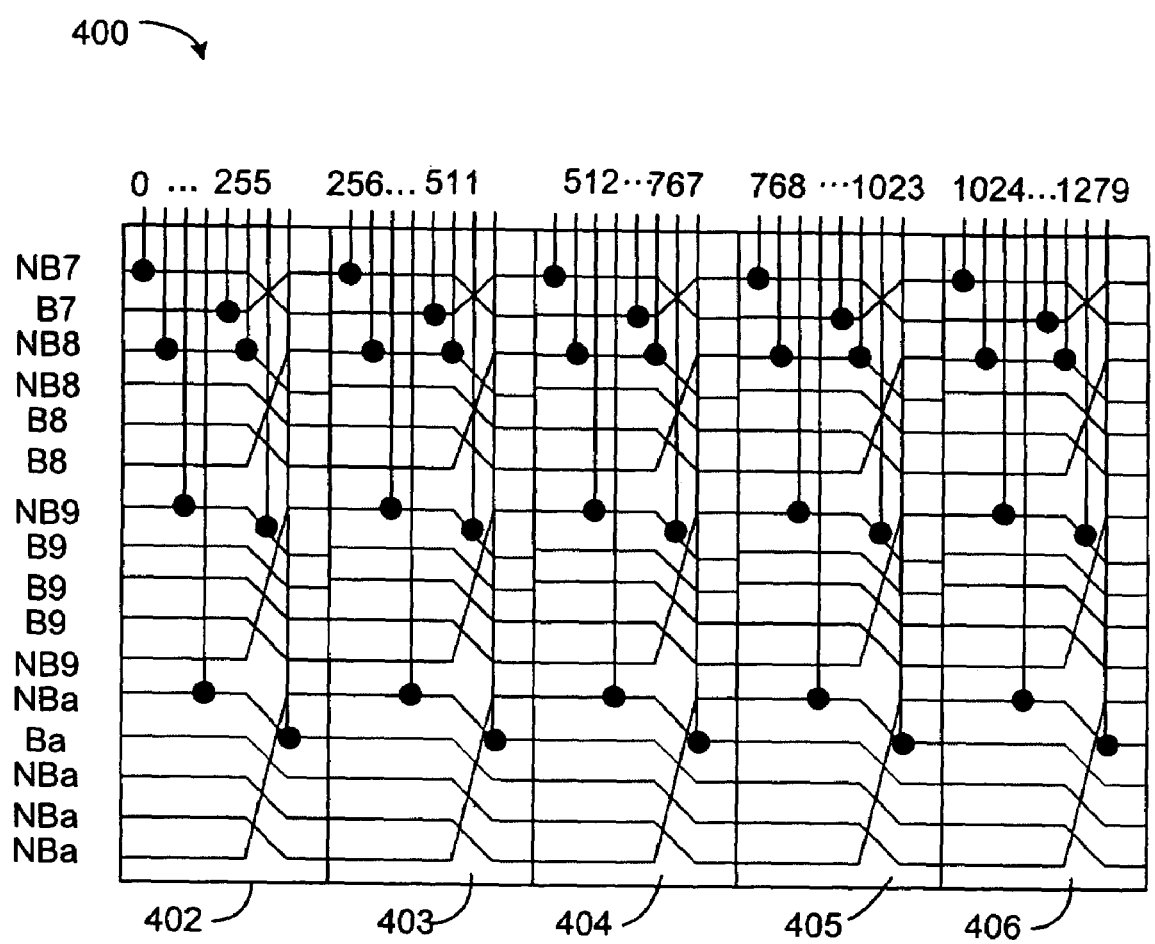
FIG. 4 is a schematic diagram of a block address line section in a generic block for use in a gray code decoder including five stitched blocks according to an embodiment.

The technique may be expanded to accommodate a larger number of blocks. FIG. 4 illustrates an exemplary gray decoder block 400 including five generic blocks 402-406 stitched together to provide 1280 decoders. The NB8/B8 section includes four signal lines, and each of the NB9/B9 and NBa/Ba sections include five signal lines. The number of signal lines, S(N), required for a given number of blocks, N, may be expressed generically by the formula S(N) =2*(2k−1)+2 (N−1).

Figure 5:
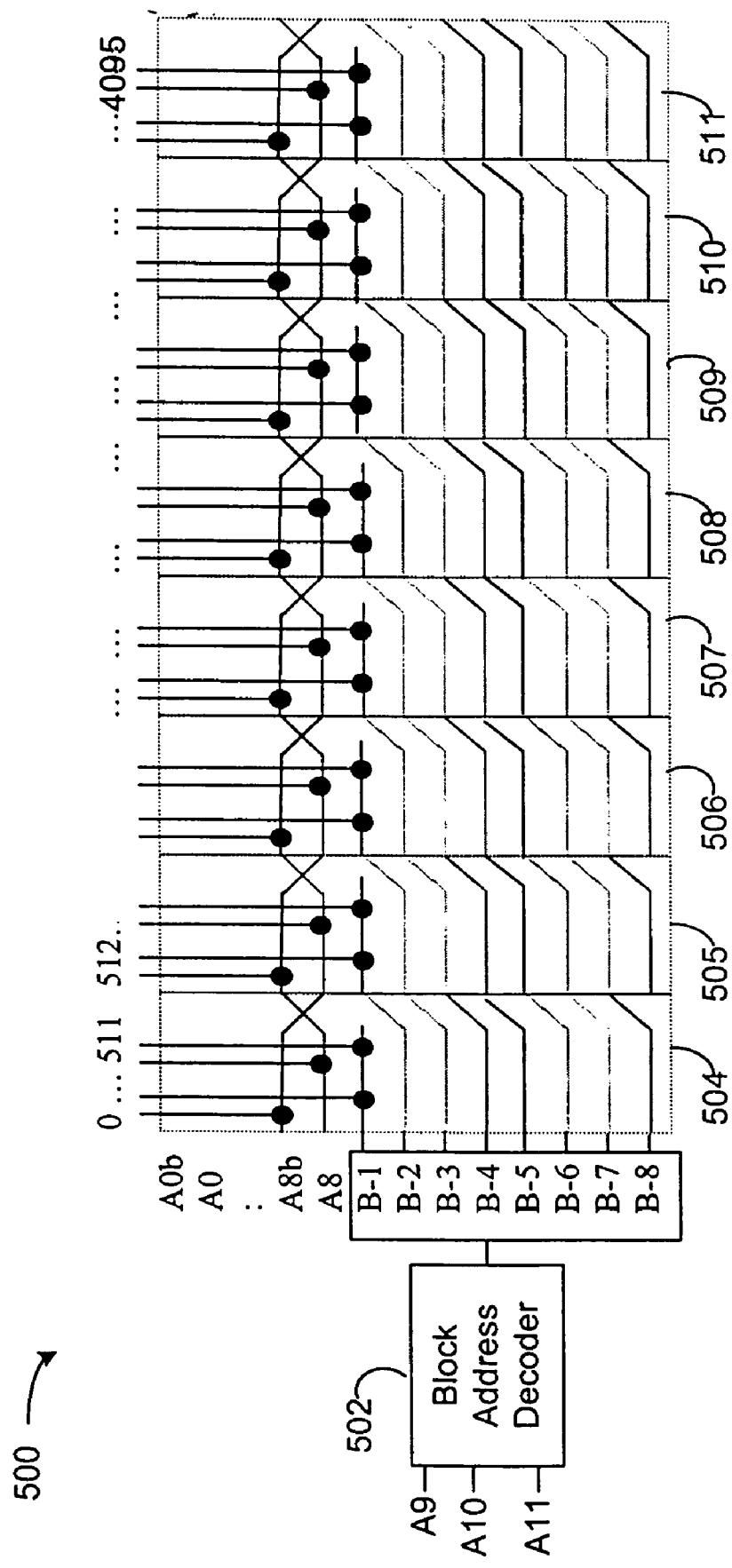
FIG. 5 is a schematic diagram of a block address line section in a generic block for use in a gray code decoder including eight stitched blocks according to an embodiment.

In an alternate embodiment, a three-bit block address line decoder 502 is used to select the block address line in a gray decoder block 500 with eight stitched generic blocks 504-511, each including 512 decoders, as shown in FIG. 5. Only eight signal lines B1 to B8 are needed to address the eight generic blocks 504-511. The technique may be expanded to accommodate a larger number of blocks. The number of signal lines, S(N), required for a given number of blocks, N, may be expressed generically by the formula S(N)=N.

For the gray decoder, signal lines A8b and A8 are switched between adjacent generic blocks. For a straight binary decoder, A8b and A8 are not switched.

Figure 6:
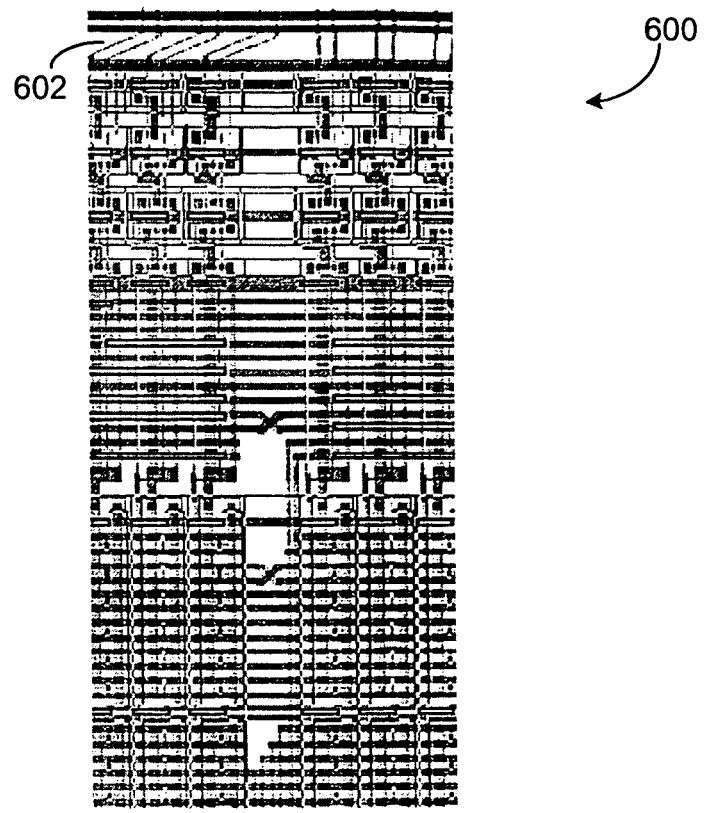
FIG. 6 is a schematic diagram of an interconnect layout for use in a decoder block including stitched blocks according to an embodiment.
Figure 7:
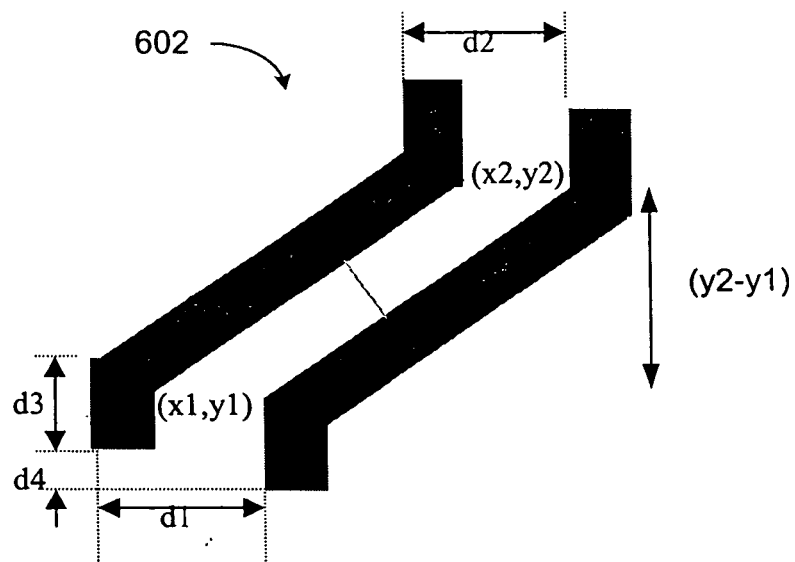
FIG. 7 is an enlarged portion of the diagram of FIG. 6 illustrating a layout for interconnect lines in the decode block.

To provide more area for the stitching routing lines between generic decoder blocks, a smaller pitch may be applied to the decoder array than the pixel pitch. FIG. 6 illustrates a decoder array 600 for use in a sensor with a 9 μm pixel pitch, where the pitch of the decoder array is reduced to 8.75 μm. In a sensor including thirty-two generic blocks, this provides an additional 8 μm of additional silicon space in which to provide the routing lines. FIG. 7 illustrates a layout for the angled connection 602 between the decoder array and the pixel array in order to minimize the distance (y2-y1).

A number of embodiments have been described. Nevertheless, it will be understood that various modifications may be made without departing from the spirit and scope of the invention. Accordingly, other embodiments are within the scope of the following claims.

Figure 8:
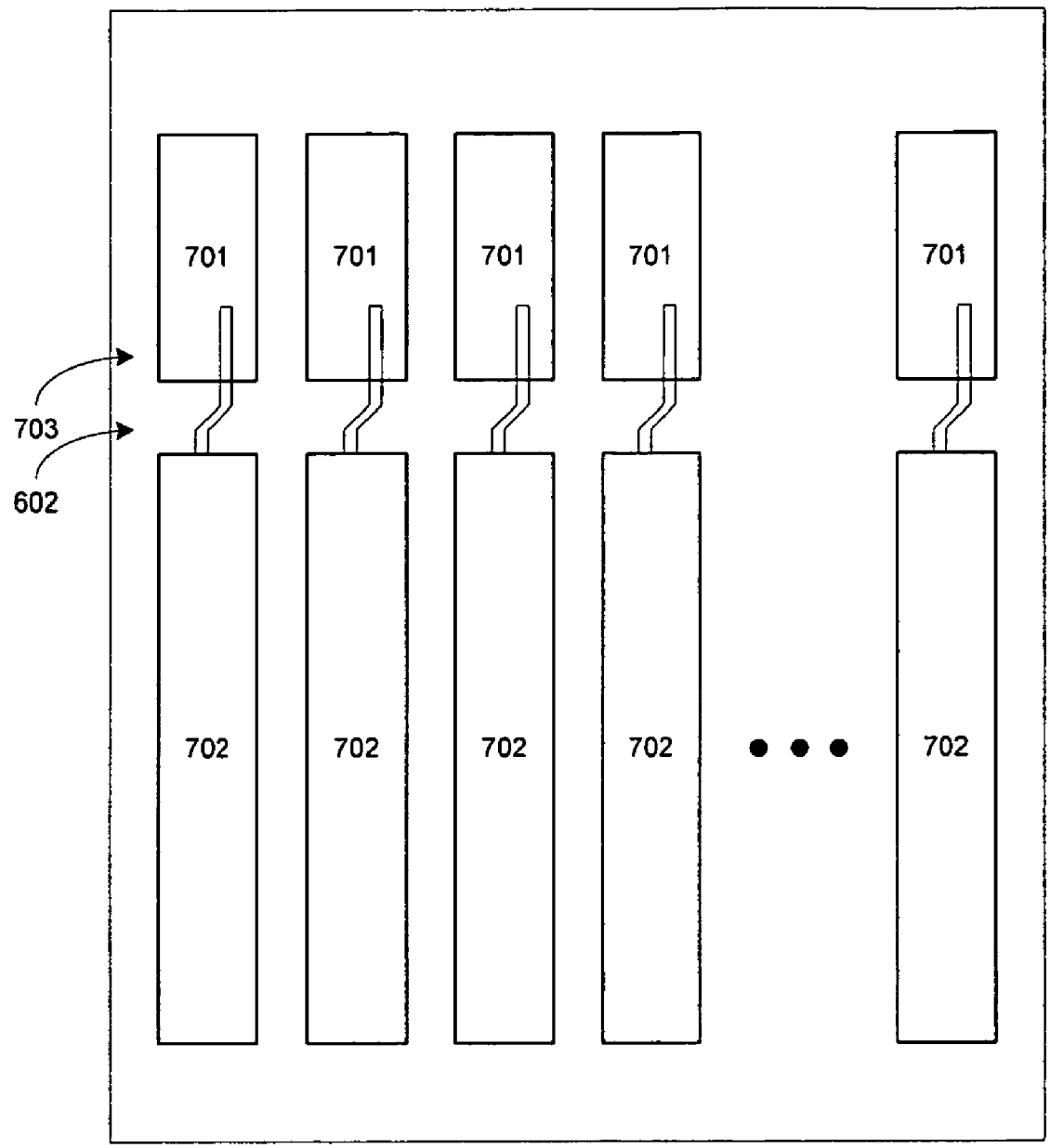
FIG. 8 is a schematic diagram showing pixel sections and decoder sections of a pixel array.

FIG. 8 is a schematic diagram showing pixel sections 701 and decoder sections 702 of an example pixel array. The pixel sections 701 have an associated routing line 703 having a first pitch. The decoder sections 702 have an associated routing line 602 having a second pitch. Although it may not be apparent, the first pitch is larger than the second pitch.

The invention claimed is:

1. A method comprising:
   patterning a pixel section of an image sensor including pixel features having a first pitch on a surface; and
   patterning a decoder section of the image sensor including features having a second pitch which is smaller than the first pitch on the surface, wherein said features include routing lines,
   wherein a ratio of the second pitch to the first pitch is less than approximately 0.98; and
   wherein the first pitch is approximately 9 μm and the second pitch is approximately 8.75 μm.

2. A method comprising:
   patterning a pixel section of an image sensor including pixel features having a first pitch on a surface; and
   patterning a decoder section of the image sensor including features having a second pitch which is smaller than the first pitch on the surface, wherein said features include routing lines,
   wherein a ratio of the second pitch to the first pitch is less than approximately 0.95, and wherein the first pitch is approximately 18 μm and the second pitch is approximately 17 μm.

* * * * *